United States Patent
van Hoorebeke et al.

(10) Patent No.: US 8,687,073 B2
(45) Date of Patent: Apr. 1, 2014

(54) MULTI-CHANNEL IMAGING DEVICES

(71) Applicant: L-3 Communications Cincinnati Electronics Corporation, Mason, OH (US)

(72) Inventors: Tristan van Hoorebeke, Maineville, OH (US); John Devitt, Maineville, OH (US)

(73) Assignee: L-3 Communications Cincinnati Electronics Corporation, Mason, OH (US)

( * ) Notice: Subject to any disclaimer, the term of this patent is extended or adjusted under 35 U.S.C. 154(b) by 0 days.

(21) Appl. No.: 13/623,477

(22) Filed: Sep. 20, 2012

(65) Prior Publication Data

US 2013/0016254 A1    Jan. 17, 2013

Related U.S. Application Data

(63) Continuation of application No. 12/364,164, filed on Feb. 2, 2009, now Pat. No. 8,300,108.

(51) Int. Cl.
*H04N 5/225*    (2006.01)

(52) U.S. Cl.
USPC ........................................ 348/218.1; 348/335

(58) Field of Classification Search
USPC ..................... 348/218.1, 265, 278–280, 335
See application file for complete search history.

(56) References Cited

U.S. PATENT DOCUMENTS

| | | |
|---|---|---|
| 5,157,258 A | 10/1992 | Gunning, III et al. |
| 5,436,453 A | 7/1995 | Chang et al. |
| 5,568,186 A | 10/1996 | Althouse |
| 5,973,844 A | 10/1999 | Burger |
| 6,587,147 B1 | 7/2003 | Li |
| 6,611,289 B1 | 8/2003 | Yu et al. |
| 6,657,749 B1 | 12/2003 | Beeson |
| 6,660,988 B2 | 12/2003 | Lee et al. |
| 6,690,049 B2 | 2/2004 | Suzuki et al. |
| 6,765,617 B1 | 7/2004 | Tangen et al. |

(Continued)

FOREIGN PATENT DOCUMENTS

| | | | |
|---|---|---|---|
| DE | 102004003013 B3 | 6/2005 | |
| EP | 1912434 A1 | 4/2008 | |

(Continued)

OTHER PUBLICATIONS

European Patent Office Communication and European Search Report for European Application EP10151848, dated Mar. 27, 2012.

*Primary Examiner* — Gevell Selby

(74) *Attorney, Agent, or Firm* — Dinsmore & Shohl LLP

(57) ABSTRACT

A multi-channel imaging device is provided. The multi-channel imaging device comprises a focal plane array comprising an array of pixels configured to detect radiation in a predetermined wavelength band. Subsets of the array of pixels are arranged to define a plurality of unit cell image areas. The multi-channel imaging device also comprises a lens array comprising a plurality of lens elements configured to image a scene onto the plurality of unit cell image areas. The lens elements and the unit cell image areas define a plurality of unit cells comprising at least one lens element and at least one unit cell image area. Each of the plurality of unit cells is configured to create a complete image of the scene. Additionally, a plurality of unit cell filters corresponding to the plurality of unit cells is configured to filter radiation such that each unit cell is dedicated to an image channel is also provided.

20 Claims, 5 Drawing Sheets

(56) References Cited

U.S. PATENT DOCUMENTS

| | | |
|---|---|---|
| 6,831,688 B2 | 12/2004 | Lareau et al. |
| 6,884,985 B2 | 4/2005 | Raynor |
| 6,909,554 B2 | 6/2005 | Liu et al. |
| 6,950,140 B2 | 9/2005 | Fukuyoshi et al. |
| 6,969,856 B1 | 11/2005 | Hillenbrand et al. |
| 7,009,652 B1 | 3/2006 | Tanida et al. |
| 7,053,952 B2 | 5/2006 | Tsuboi |
| 7,109,488 B2 | 9/2006 | Milton |
| 7,138,619 B1 | 11/2006 | Ferrante et al. |
| 7,139,028 B2 | 11/2006 | Itano et al. |
| 7,236,304 B2 | 6/2007 | Okayama et al. |
| 7,242,478 B1 | 7/2007 | Dombrowski et al. |
| 7,262,799 B2 | 8/2007 | Suda |
| 7,274,454 B2 | 9/2007 | Kowarz et al. |
| 7,280,146 B2 | 10/2007 | Takahashi et al. |
| 7,297,919 B2 | 11/2007 | Mishina et al. |
| 7,339,614 B2 | 3/2008 | Gruber et al. |
| 7,351,972 B2 | 4/2008 | D'Souza et al. |
| 7,405,761 B2 | 7/2008 | Feldmen et al. |
| 7,423,679 B2 | 9/2008 | Szajewski et al. |
| 7,772,532 B2 | 8/2010 | Olsen et al. |
| 2004/0223071 A1 | 11/2004 | Wells et al. |
| 2005/0083531 A1* | 4/2005 | Millerd et al. ............... 356/450 |
| 2005/0128335 A1 | 6/2005 | Kolehmainen et al. |
| 2005/0134698 A1 | 6/2005 | Schroeder et al. |
| 2005/0134699 A1 | 6/2005 | Nagashima et al. |
| 2005/0205758 A1 | 9/2005 | Almeida |
| 2006/0055811 A1 | 3/2006 | Frtiz et al. |
| 2006/0072029 A1 | 4/2006 | Miyatake et al. |
| 2007/0109438 A1 | 5/2007 | Duparre et al. |
| 2007/0126913 A1 | 6/2007 | Kang |
| 2007/0146533 A1 | 6/2007 | Yun |
| 2007/0153116 A1 | 7/2007 | Nakao et al. |
| 2007/0187576 A1 | 8/2007 | Sakoh et al. |
| 2007/0188653 A1 | 8/2007 | Pollock et al. |
| 2007/0206110 A1 | 9/2007 | Wada |
| 2007/0257184 A1 | 11/2007 | Olsen et al. |
| 2007/0263114 A1 | 11/2007 | Gurevich et al. |
| 2008/0165270 A1 | 7/2008 | Watanabe et al. |
| 2008/0170140 A1 | 7/2008 | Silver et al. |
| 2008/0179520 A1 | 7/2008 | Kauffman et al. |
| 2008/0211956 A1 | 9/2008 | Imada et al. |

FOREIGN PATENT DOCUMENTS

| | | |
|---|---|---|
| FR | 2833794 A1 | 6/2003 |
| JP | 2007018387 | 1/2007 |
| WO | 2005/089369 A2 | 9/2005 |
| WO | 2008/085679 A1 | 7/2008 |

* cited by examiner

MULTI-CHANNEL IMAGING DEVICES

CROSS-REFERENCE TO RELATED APPLICATIONS

This application is a continuation of U.S. patent application Ser. No. 12/364,164, filed on Feb. 2, 2009 and entitled "Multi-Channel Imaging Devices."

TECHNICAL FIELD

Embodiments of the present disclosure relate to imaging devices, and more particularly, to compact multi-channel imaging devices.

BACKGROUND

Forward looking infrared (FLIR) sensors are imaging devices that detect infrared radiation to create an image of a scene. FLIR sensors commonly utilize a two dimensional array of pixels such as a focal plane array (FPA) to form the infrared image. The pixels of infrared FPAs, for example, are formed of a material that is sensitive to infrared radiation, such as indium antimonide (InSb), Mercury Cadium Telluride (MCT), or other infrared-sensitive materials. FLIR sensors are typically configured to operate within long-wave infrared (e.g., 8-14 µm) and mid-wave infrared (e.g., 3-5 µm) bands. Infrared light is focused onto the pixels of the FPA which then generate a signal such as a voltage that corresponds to the level of infrared light detected. The signals generated by the pixels may then be sent to other internal or external system electronics to be compiled into a thermal image of the scene. As many infrared FPAs operate most effectively at very cold temperatures, the FPAs of FLIR sensors are commonly cryogenically cooled within a dewar flask.

Particular FLIR sensors may be configured to filter infrared radiation to a particular channel. For example, a FLIR sensor may incorporate a filter that provides either multi-spectral (i.e., Red, Green and Blue regions of a nominal wavelength band under detection), polarimetric or panchromatic filtering. Multi-spectral and polarimetric imagery utilize the comparison of the images from each channel, and therefore require accurate image registration to prevent false signals. Therefore, simultaneous capture of multi-spectral and polarimetric imagery is required. Under current FLIR design, a single FLIR sensor is either dedicated to one particular channel by a single passband filter, or is filtered at the individual pixel level, which requires very small filter patterns at the pixel pitch dimension. Such small filters or small filter patterns are difficult and expensive to manufacture and implement in a FLIR sensor. Additionally, requiring at least one FLIR sensor for imaging in each desired channel adds significant weight to the imaging system, should simultaneous capture of multi-spectral and polarimetric imagery be desired.

FLIR sensors or cameras are utilized in many applications, including target acquisition in naval vessels and aircraft, surveillance, search and rescue, and use on unmanned aerial vehicles (UAVs). Particularly, FLIR sensors require technology for high-resolution imagery with contrast enhancement for better target identification. Further, some applications, such as those aboard an UAV, which are commonly extremely light and cannot carry significant weight, require FLIR sensors that provide for high-resolution imagery and low noise attributes in a package of very low mass and volume. Therefore, high-resolution imagery in such applications should be achieved with the use of minimal, lightweight components.

SUMMARY

Accordingly, it is against this background that compact, multi-channel imaging devices that provide high-resolution imagery with broadband panchromatic, multi-spectral and polarimetric content in a single package are desired.

According to one embodiment, a multi-channel imaging device is provided. The multi-channel imaging device includes a focal plane array comprising an array of pixels configured to detect radiation in a predetermined wavelength band. Subsets of the array of pixels are arranged to define a plurality of unit cell image areas. The multi-channel imaging device also includes a lens array comprising a plurality of lens elements configured to image a scene onto the plurality of unit cell image areas. The lens elements and the plurality of unit cell image areas define a plurality of unit cells, each unit cell comprising at least one lens element and at least one unit cell image area. Each of the unit cells is configured to create a complete image of the scene. Additionally, a plurality of unit cell filters corresponding to the plurality of unit cells is configured to filter radiation corresponding to the scene such that each unit cell is dedicated to an image channel.

According to another embodiment, a multi-channel imaging device is also provided. According to the embodiment, the multi-channel imaging device includes a plurality of unit cells, each unit cell comprising an array of pixels and a lens element. The pixels of the array are configured to detect radiation in a predetermined band. Each unit cell of the plurality of unit cells is configured to generate a complete image of a scene to be combined into at least one multi-channel image, wherein each unit cell is dedicated to an image channel.

According to yet another embodiment, a multi-channel imaging device is also provided. According to the embodiment, the multi-channel imaging device includes a plurality of unit cells, each unit cell is dedicated to an image channel and configured to generate a complete image of a scene. Each unit cell comprises an array of pixels capable of detecting radiation in a predetermined band, and a lens element configured to image the complete image onto the array of pixels and arranged having an offset relative to the array of pixels within the unit cell such that there is a sub-pixel shift of the complete image relative to the complete image of adjacent unit cells.

According to yet another embodiment, a method of generating multi-channel imagery of a scene is provided. The method includes receiving a plurality of complete images of the scene from a multi-channel imaging device. The multi-channel imaging device includes a plurality of unit cells, wherein each unit cell includes an array of pixels and a lens element. The pixels are configured to detect radiation in a predetermined wavelength band. Each unit cell is configured to generate a complete image of the scene and is dedicated to an image channel. The method further includes combining the plurality of complete images provided by the plurality of unit cells, thereby generating multi-channel imagery of the scene.

BRIEF DESCRIPTION OF THE DRAWINGS

The following detailed description will be more fully understood in view of the drawings in which.

Figure 1:
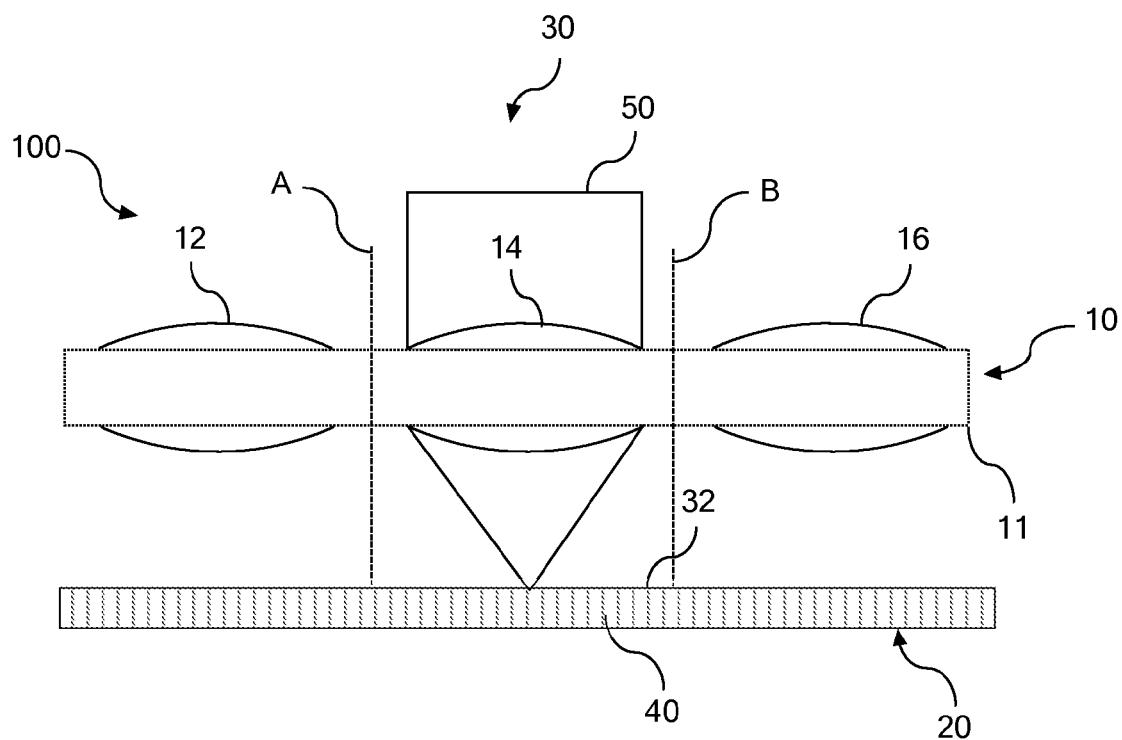
FIG. 1 is a schematic illustration of a cross sectional view of a portion of an exemplary multi-channel imaging device according to one or more embodiments.

The embodiments set forth in the drawings are illustrative in nature and are not intended to be limiting of the invention defined by the claims. Moreover, individual features of the drawings and the invention will be more fully apparent and understood in view of the detailed description.

DETAILED DESCRIPTION OF ILLUSTRATIVE EMBODIMENTS

Embodiments of the present disclosure relate to multi-channel imaging devices. More specifically, embodiments may provide high-resolution infrared imagery with broad-band panchromatic intensity levels, multi-spectral content, as well as range and polarimetric information for enhanced object discrimination and identification utilizing a single focal plane array (FPA). Further, particular embodiments also increase the size and decrease the complexity of filters used to filter image content, thereby reducing manufacturing and production costs. According to some embodiments, a sub-pixel parallax may be utilized to yield high-resolution imagery, provide for range estimates of targets, and discriminate a moving object from background clutter.

Figure 2:
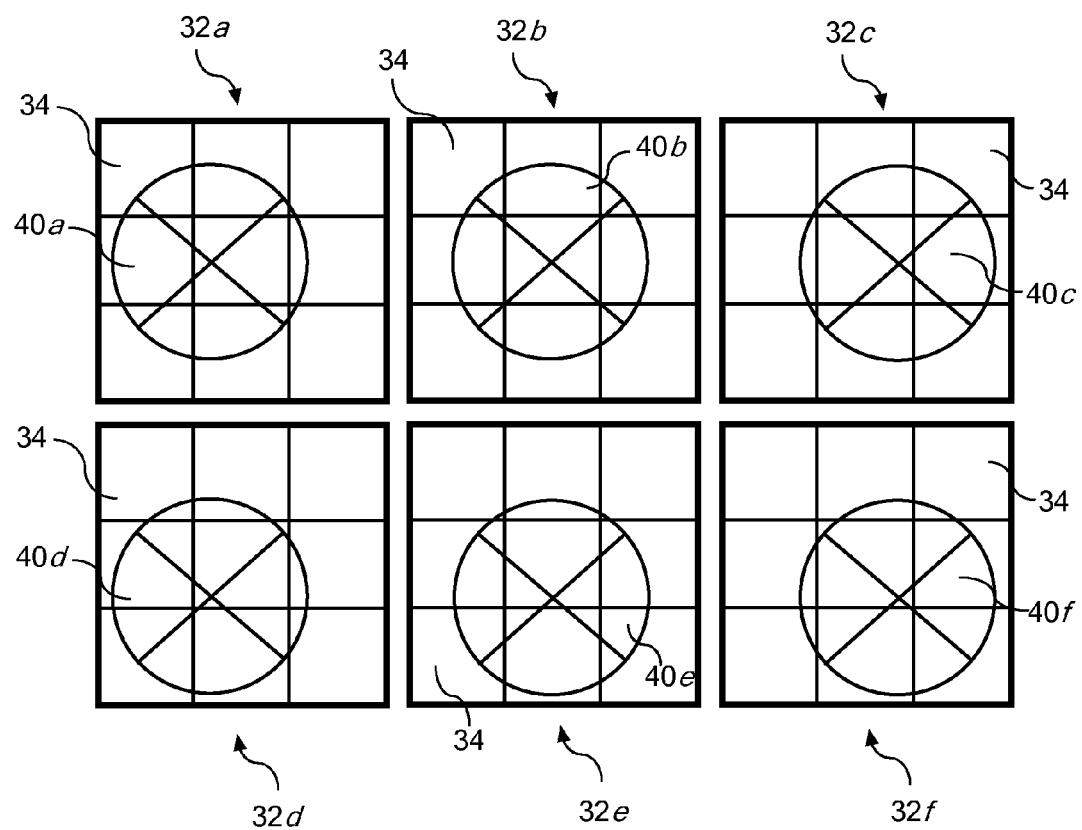
FIG. 2 is a schematic illustration of a plurality of exemplary unit cells and offset images focused thereon according to one or more embodiments.
Figure 3:
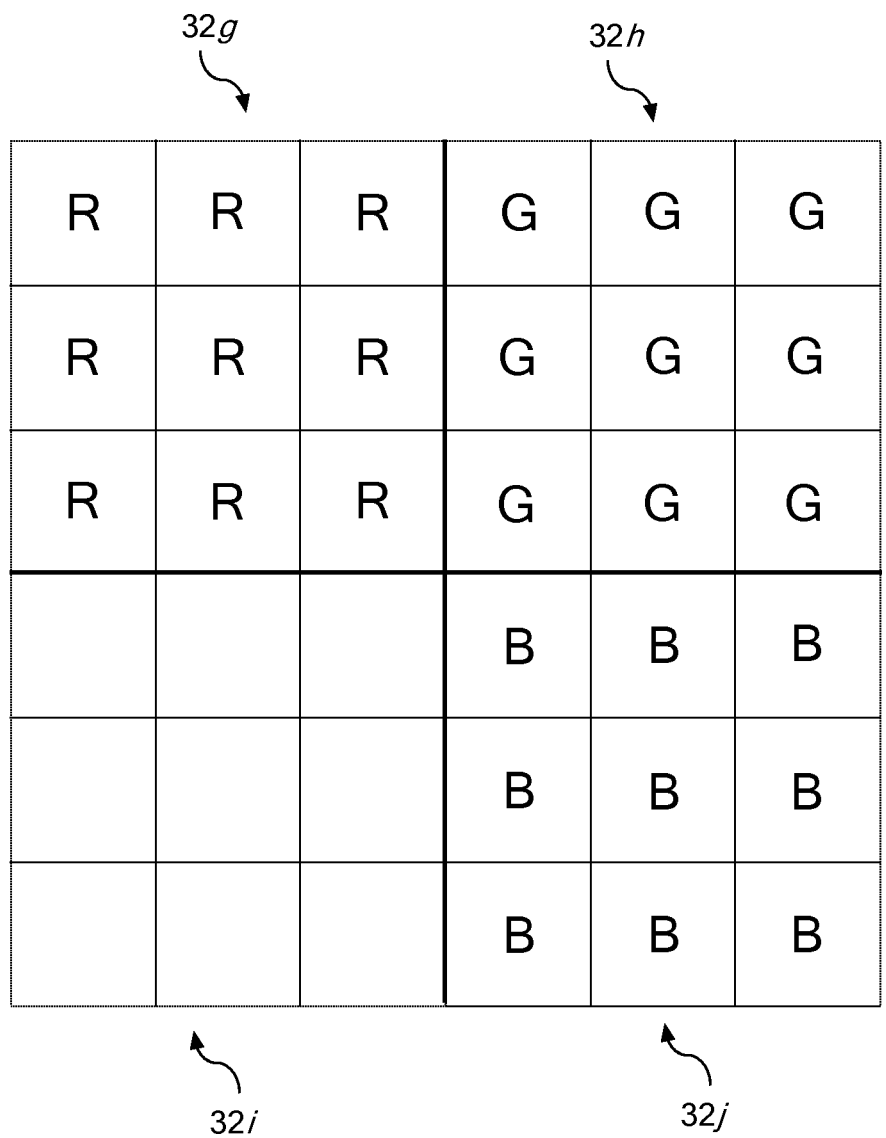
FIG. 3 is a schematic illustration of four exemplary filtered unit cells according to one or more embodiments.
Figure 4:
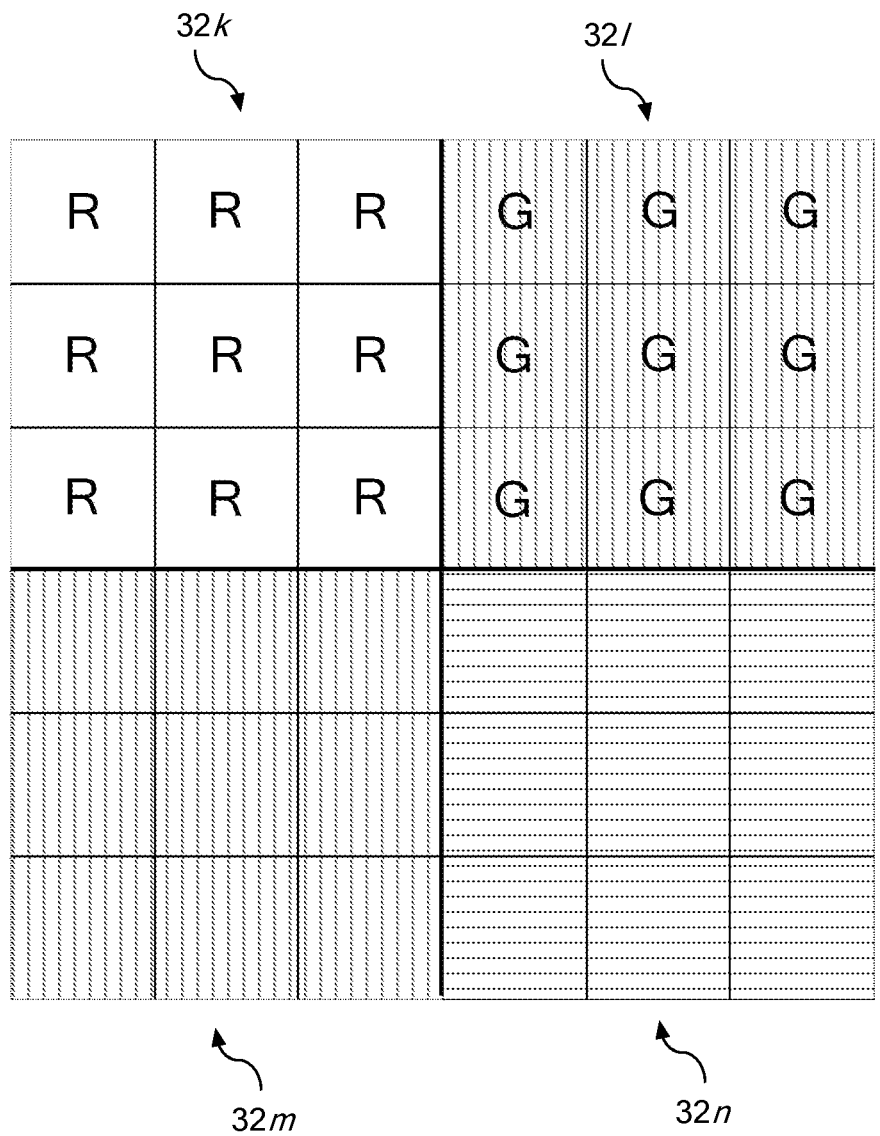
FIG. 4 is a schematic illustration of four exemplary filtered unit cells according to one or more embodiments.

Referring to FIG. 1, as well as FIGS. 2-4, a portion of an exemplary imaging device 100 (such as a compact, cooled FLIR camera, for example) is illustrated. It is noted that the term camera and sensor may be utilized interchangeably herein. According to some embodiments, the camera may operate in the mid-wave infrared band. It is also contemplated that, although embodiments of the present disclosure are described herein in the context of infrared imaging devices, embodiments may also be configured for detection in other wavelength bands, such as in the visible wavelength band, for example. The exemplary device 100 comprises a focal plane array 20 having a plurality of pixels arranged in an array, a lens array 10 comprising multiple lens elements (e.g., 12, 14, and 16) arranged in a plane, and appropriate lens element baffling 11. A plurality of unit cells 30 comprising a single lens element (e.g., lens element 14) and an image area 32 defined by a rectangular portion of the focal plane array 20 (see FIGS. 2-4) create a full image of a scene, object or target. The image area 32 comprises a subset of pixels 34 of the focal plane array 20. A unit cell 30 may be defined as the components positioned between dashed lines A and B.

The pixels 34 (see FIGS. 2-4) of the pixel array 20 may be configured as diodes comprising a material capable of detecting radiation in the infrared wavelength region (i.e., a predetermined wavelength band), such as indium antimonide (InSb), and may be formed on a support substrate (not shown) by reticulation or any other currently known or yet-to-be-developed process. The pixels 34 may provide a signal or signal value such as a voltage that corresponds to the level of radiation detected. For example, when a pixel detects a high level of infrared radiation, it may provide a voltage that is higher than a pixel that detects a low level of infrared radiation. The signals provided by the pixels of the unit cells make up a complete image of the scene.

Each image area 32 may comprise a subset array of pixels 34 of the focal plane array 20. For example, as illustrated in FIGS. 2-4, the pixels 34 may be arranged within each image area 32 by rows and columns. Although FIGS. 2-4 illustrate each image area 32 of the unit cell 30 having rows and columns of three pixels 34 each for a total of nine pixels 34, any number of pixels 34 may be utilized within each image area 32.

The lens array 10 may be positioned within a dewar flask in a plane that is in front of the focal plane array 20 with respect to the path of radiation (e.g., 50) entering the sensor 100. Each lens element 12, 14, 16 of the array may be positioned and secured within the dewar flask by any type of baffling 11, which may comprise, by way of example and not by way of limitation, a pinhole mask boresighted to each lens element. The lens elements 12, 14, 16, which may be micro lenses according to some embodiments, may be sized according to the desired size of each unit cell 30. The lens array 10 may be fabricated by methods known to those skilled in the art or any yet-to-be developed methods. By way of example and not limitation, the lens elements 12, 14, 16, of the lens array 10 may comprise plano-convex lenses etched into a silicon wafer by photo-lithography methods.

The lens elements 12, 14, 16 may be objective lenses that focus a complete image of the scene, target or object upon the pixels 34 of each image area 32. FIG. 2 is a schematic representation of an image 40a-f focused onto six exemplary image locations 32a-f. It is noted that only six image areas 32a-f are illustrated for simplicity and embodiments of the multi-channel imaging devices 100 disclosed herein may comprise many more unit cells 30. Each unit cell 30 is configured to provide a separate and complete image 40a-f of the same scene, target or object. As described hereinbelow, the complete images 40a-f provided by the unit cells 30 may be collected and combined into a higher resolution image or images.

According to some embodiments, the lens elements (e.g., 12, 14, 16 of FIGS. 1 and 5) are arranged and positioned within the lens array 10 such that the location of an image (e.g., 40a-f of FIG. 2) within each image area 32 is offset with respect to the image locations within adjacent image areas. The center to center spacing of the lenses may be chosen such that an offset is seen in registering the images relative to their respective image of the scene. For example, the location of the image 40a that is focused onto image area 32a by a particular lens element (not shown) is shifted left of center. The location of image 40a is therefore offset relative the location of image 40b within image area 32b, as well as the location of image 40d within image area 32d. Similarly, the location of image 40b is offset from the locations of images 40c and 40e that are focused upon image areas 32c and 32e, respectively, as well as the location of image 40a within 32a. According to the illustrated embodiment, the plurality of full images 40a-f are imaged by corresponding lens elements at different locations upon the image areas 32a-f with respect to one another. Shifting the location of the images 40a-f in such a manner described above creates a parallax between adjacent image cells 30.

The images 40 may be shifted by an offset value that is less than a width of one pixel. The sub-pixel image shift described above may be utilized to provide for high resolution imagery. Once the images are collected, the lower resolution images from each unit cell may be recombined to a higher resolution by image reconstruction algorithms, such as super resolution techniques known in the art, or other yet-to-be-developed algorithms and techniques. By using the sub-pixel parallax induced image shifts from one unit cell 30 to the next, super resolution algorithms may improve resolution of the images many times to yield high resolution imagery. Offsetting the images 40 enables increased detection of high spatial frequency content of objects that may be imaged by the imaging device 100. This may be achieved by effectively sampling the scene at a higher rate than the pixel pitch nominally affords, thereby reducing the aliasing in the image due to high spatial frequency content according to the Sampling Theorem.

Referring again to FIG. 2, a complete image 40b is positioned in the center of image area 32b. The pixel in the center of the image area 32b will provide a relatively large signal value in detecting incoming radiation, while the remaining pixels within image area 32b will provide a relatively smaller signal value than the pixel in the center of image area 32b. Referring now to image area 32a, the complete image 40a is shifted to the left by a sub-pixel offset value of approximately one-half of a pixel with respect to the location of image 40b. The pixel in the center of image area 32a may still provide a relatively large signal value, however, the pixels in the left column within image area 32a will provide larger signal values than those pixels in the left column of image area 32b.

Sampling the scene, target or object at multiple image shifts may provide more detail in the resulting reconstructed image or images. For example, to detect high spatial frequency content within a scene, such as a building or other manmade structure, the image reconstruction algorithm may detect small changes between the images provided by the unit cells 30. For example, the image 40a focused upon image area 32a may be slightly different than the image 40b focused upon image area 32b. The detected changes between the images provided by the unit cells 30 provide high-resolution detail that may be incorporated into the reconstructed image. The images 40a-f within image areas 32a-f of FIG. 2 are shifted by approximately one-half of a pixel with respect to one another, which may provide approximately twice the resolution of an imaging device that does not offset or shift the location of the image. Embodiments that shift the image location by one-quarter of a pixel, for example, may achieve four times the resolution. The offsets provided by the lens elements (e.g., 12, 14, 16) of the lens array 10 may be fixed and calibrated for reduced computation time and improved accuracy when restoring the higher resolution imagery. Shifting the images as described above may allow for significant resolution improvement in the final restored image or images without the need to alter the design of the focal plane array 20, thereby reducing the cost and complexity of the multi-channel imaging device 100. However, it is contemplated that the unit cell 30 configuration and image offsets described hereinabove may also be utilized in conjunction with other high-resolution techniques known to those skilled in the art, or techniques that are yet to be developed.

Image reconstruction or processing algorithms discussed herein may be executed by an image processing device or system that may be an integral component of the multi-channel imaging device 100. According to other embodiments, the multi-channel imaging device 100 may electronically transmit data representing the complete images received from the plurality of unit cells 30 to an external or off-site image processing device or system configured to reconstruct the plurality of images into multi-channel imagery. The image processing device or system may comprise dedicated electronics and software programmed to execute image reconstruction and processing algorithms. According to other embodiments, the image processing device or system may comprise a general purpose computer that receives the image data from the multi-channel imaging device 100 through an electronic communication channel (e.g., satellite or cellular communication channels) and executes the image reconstruction and processing algorithms.

Figure 5:
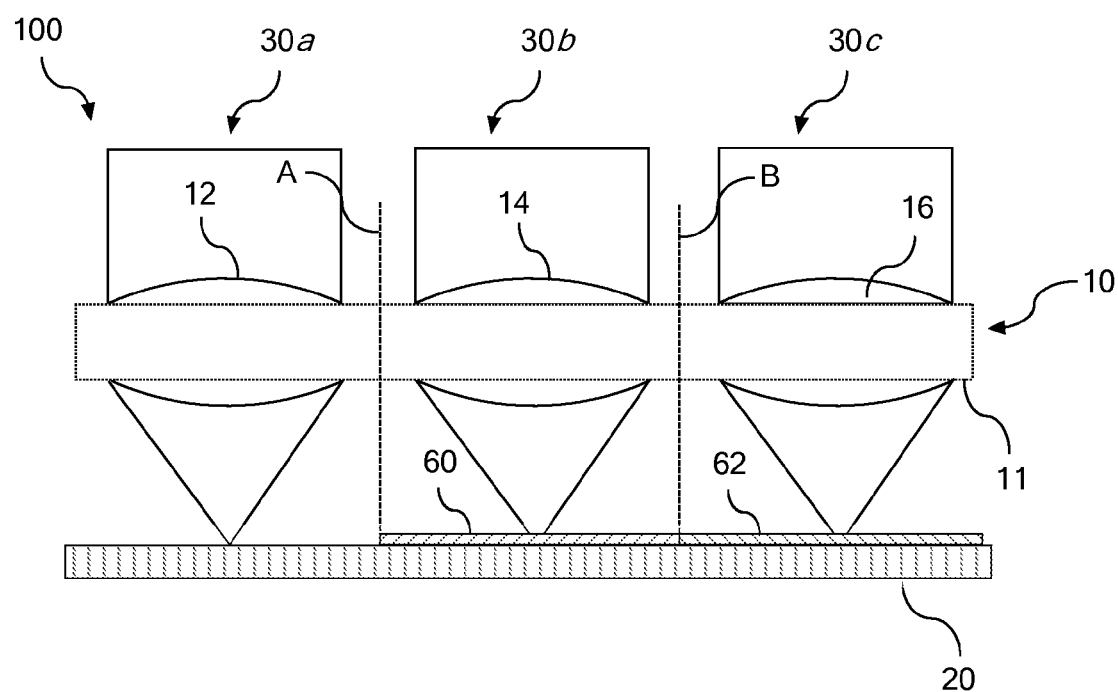
FIG. 5 is a schematic illustration of a cross sectional view of a portion of an exemplary multi-channel imaging device according to one or more embodiments.

Because each unit cell 30 is configured to form a separate and complete image of the same scene, target or object as described hereinabove, each unit cell 30 may be filtered to extract a single image channel. For example, image channels may comprise, but are not limited to, multi-spectral, panchromatic, polarimetric and spectro-polarimetric. Referring to FIGS. 3 and 5, for multi-spectral filtering, a thin film interference filter 62 may be deposited directly onto the focal plane array 20, covering a subset of pixels on the focal plane array 20 (i.e., an image area 32 of a unit cell 30).

The multi-spectral channel may comprise, for example, a red channel, a blue channel or a green channel. The terms red channel, green channel and blue channel herein refer to portions of a nominal band under detection (e.g., the predetermined wavelength band) and not necessarily the wavelengths in the red (e.g., ~600 nm), green (e.g., ~500 nm) and blue (e.g., ~400 nm) regions of the visible spectrum. By way of example and not limitation, if the FPA pixels are configured to detect radiation in the 1 μm to 5 μm wavelength range, the red channel may be 1-2 μm, the green channel 2-3 μm and the blue channel 4-5 μm. According to the embodiment illustrated in FIG. 3, a patterned filter configured to filter infrared radiation to the red band (i.e., a red channel) is deposited onto all of the pixels of image area 32g. FIG. 5 illustrates patterned filters 62 and 64 that are deposited onto the focal plane array 20. Similarly, image area 32h comprises a filter that filters to the green band while image area 32j is dedicated to the blue band. Image area 32i may be configured as an open band without filtering to extract panchromatic scene imagery with highest signal to noise ratio. The panchromatic image will filter the least amount of light, improving throughput and signal levels. Because the unit cells 30 form complete images of the scene, target, or object, the filters may be increased in size from roughly the pixel pitch dimension to the size of the image area 32 of the unit cell 30, which may be many times the pixel pitch dimension. This increased size of the filters reduces manufacturing complexities, as well as edge effects both in pattern deposition due to shadowing and in imaging due to diffraction.

Full unit cells 30 may also be dedicated to different polarization orientations. FIG. 4 illustrates four exemplary image areas 32k-n of particular unit cells 30. Image areas 32m and 32n are dedicated to two different, orthogonal polarization orientations. Polarization filtering may be achieved by applying wire grid polarizers to the focal plane array 20 or to the lens elements (e.g., 12, 14, 16) of the lens array 10. Because the wire grid polarizers may cover many pixels rather than single, individual pixels, manufacturing costs may be reduced. Additionally, extinction ratios may also be improved by the reduction of diffraction effects from the aperture edges of the filter elements.

Unit cells may also be dedicated to a spectro-polarimetric channel, wherein a particular unit cell 30 that is dedicated to a particular spectral band is further filtered for a single polarimetric state. Spectro-polarimetric may be defined as a combination of a multi-spectral channel and a polarimetric channel. Image area 32i is dedicated to a spectro-polarimetric channel that comprises both a filter configured to filter radiation to the green band of the multi-spectral channel as well as a filter configured to filter radiation to a particular polarization orientation.

FIG. 5 illustrates a side view of three unit cells 30a-c of an exemplary multi-channel imaging device 100. Unit cells 30 dedicated to particular channels may be arranged across the focal plane array 20 in any order or configuration that fits the demands of the particular application in which the multi-channel imaging device 100 is designed to operate. Unit cell 30a is configured as open-band for panchromatic imagery, while unit cell 30b comprises a wire grid polarizer 60 for polarimetric imagery and unit cell 30c comprises an interference filter 64 for multi-spectral imagery, which may be dedicated to the red, blue or green band or channel. Additionally, spectro-polarimetric imagery may be achieved by depositing a wire grid polarizer (e.g., 60) on top of a thin film multi-spectral filter (e.g., 62). According to other embodiments, the filters may also be placed on the lens elements themselves to avoid manufacturing complications in particular focal plane technologies. A filter deposited on a lens element such as 12, 14, or 16 may be desired in spectro-polarimetric dedicated unit cells 30, wherein the multi-spectral filter may be deposited on the lens element and the multi-spectral filter deposited onto the focal plane array 20.

Embodiments of the present disclosure enable multi-spectral, polarimetric, spectro-polarimetric, and panchromatic imagery to be simultaneously extracted from a scene by an arrangement of dedicated unit cells 30 across a single focal plane 20. As described hereinabove, the low resolution unit cell images may be collected and reconstructed to create a high resolution, multi-channel image or images using conventional and yet-to-be-developed reconstruction algorithms. For example, the complete images provided by unit cells dedicated to a particular channel may be combined into a high resolution image for that particular channel, resulting in separate high-resolution images for each channel. According to other embodiments, all of the complete images provided by the unit cells may be combined into one image such that content for a particular channel may be later extracted.

The complete images provided by the dedicated unit cells 30 may provide detailed information about the scene, target or object that is detected. For example, according to some embodiments, pairs of polarimetric dedicated unit cells with orthogonal polarization orientation, such as unit cells 32m and 32n illustrated in FIG. 4, may be arranged across the focal plane array 20 to discern man-made objects from natural objects within a scene. Comparing the orthogonally polarized images allows for the detection of linear polarization by registration between the images for appropriate pixelwise addition and subtraction of the respective polarization states. Additionally, comparing separate images in a given band may provide a more complete extraction of scene content. By using an inherent parallax that exists between the individual unit cells dedicated to a particular channel, range estimates of a target may be calculated and moving objects within a scene may be differentiated from background clutter. Because each unit cell 30 views the same object from a slightly different perspective, parallax is present, where the object distance, baseline between the unit cells 30 and focal length of the lenses determine the relative offset of the object from one sub-image to the next. An algorithm may compare the object location in each sub-image for multiple time frames to estimate both range and motion.

It is noted that terms such as "commonly," and "typically," if utilized herein, should not be read to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "approximately" is utilized herein to represent the inherent degree of uncertainty that may be attributed to any quantitative comparison, value, measurement, or other representation. The term "approximately" is also utilized herein to represent the degree by which a quantitative representation may vary from a stated reference without resulting in a change in the basic function of the subject matter at issue.

It is noted that recitations herein of a component of the present invention being "programmed" or "configured" in a particular way, "programmed" or "configured" to embody a particular property, or function in a particular manner, are structural recitations as opposed to recitations of intended use. More specifically, the references herein to the manner in which a component is "configured" denotes an existing physical condition of the component and, as such, is to be taken as a definite recitation of the structural characteristics of the component.

It is also noted that the use of the phrase "at least one" in describing a particular component or element does not imply that the use of the term "a" in describing other components or elements excludes the use of more than one for the particular component or element. More specifically, although a component may be described using "a," it is not to be interpreted as limiting the component to only one.

The foregoing description of the various embodiments of the invention has been presented for the purposes of illustration and description. It is not intended to be exhaustive or to limit the invention to the precise steps and/or forms disclosed. Many alternatives, modifications and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the inventions as defined by the claims.

What is claimed is:

1. A multi-channel imaging device comprising:
    a focal plane array comprising an array of pixels configured to detect radiation in a predetermined wavelength band, wherein subsets of the array of pixels are arranged to define a plurality of unit cell image areas;
    a lens array comprising a plurality of lens elements configured to image a scene onto the plurality of unit cell image areas, wherein:
        the plurality of lens elements and the plurality of unit cell image areas define a plurality of unit cells;
        each unit cell comprises at least one lens element and at least one unit cell image area; and
        each unit cell is configured to create a complete image of the scene; and
        lens elements of the plurality of lens elements are arranged within the lens array having an offset relative to a plurality of pixels within the unit cells such that there is a sub-pixel shift of the complete image relative to the complete image provided by adjacent unit cells;
    a plurality of unit cell filters corresponding to the plurality of unit cells configured to filter radiation corresponding to the scene such that each unit cell is dedicated to a dedicated image channel, wherein each unit cell filter spans more than one individual pixel; and
    an image processing device that extracts one or more low resolution images from one or more unit cells, and one or more high resolution images from multiple unit cells, wherein the one or more high resolution images are based at least in part on the offset of the lens elements corresponding to the multiple unit cells.

2. The multi-channel imaging device as claimed in claim 1, wherein the dedicated image channel comprises a spectral channel, a panchromatic channel, a polarimetric channel, or a combination thereof.

3. The multi-channel imaging device as claimed in claim 2, wherein the one or more low resolution images is a spectral or polarimetric image.

4. The multi-channel imaging device as claimed in claim 2, wherein the spectral channel comprises a long wavelength spectral channel configured to detect radiation in a long wavelength portion of the predetermined wavelength band, a mid-wavelength spectral channel configured to detect radiation in a mid-wavelength portion of the predetermined wavelength band, or a short wavelength spectral channel configured to detect radiation in a short wavelength portion of the predetermined wavelength band.

5. The multi-channel imaging device as claimed in claim 1, wherein the multi-channel imaging device comprises at least one pair of adjacent unit cells dedicated to a spectral-polarimetric channel or a polarimetric channel such that a polarization orientation of the radiation filtered by a first unit cell of the at least one pair of adjacent unit cells is orthogonal to a polarization orientation of the radiation filtered by a second unit cell of the at least one pair of adjacent unit cells.

6. The multi-channel imaging device as claimed in claim 5, wherein the lens element of each unit cell is configured and positioned to focus the complete image of the scene onto the array of pixels at an image location such that there is a sub-pixel offset between the image location of adjacent unit cells, thereby forming a sub-pixel parallax between complete images provided by adjacent unit cells.

7. The multi-channel imaging device as claimed in claim 6, wherein the image processing device detects high spatial content of the scene based at least in part on the sub-pixel parallax between the complete images provided by adjacent unit cells.

8. The multi-channel imaging device as claimed in claim 7, wherein the image processing device provides range estimation of a target based on the sub-pixel parallax.

9. The multi-channel imaging device as claimed in claim 1, wherein one or more unit cell filters of the plurality of unit cell filters are configured such that selected unit cells are dedicated to a spectro-polarimetric channel.

10. The multi-channel imaging device as claimed in claim 9, wherein the one or more unit cell filters of the plurality of unit cell filters corresponding to the spectro-polarimetric channel comprise a thin film spectral filter positioned on the focal plane array and a polarimetric filter positioned on the lens element of the unit cell.

11. The multi-channel imaging device as claimed in claim 1, wherein one or more unit cell filters of the plurality of unit cell filters comprise a thin film filter, a wire grid polarizer, or a combination thereof, that is larger than a pixel pitch dimension of the array of pixels.

12. The multi-channel imaging device as claimed in claim 1, wherein the selected ones of the plurality of unit cell filters are positioned on the focal plane array, the lens elements of the lens array, or a combination thereof.

13. A method of generating multi-channel imagery of a scene comprising:
receiving a plurality of complete images of the scene from a multi-channel imaging device comprising a plurality of unit cells, each of the unit cells comprising an array of pixels configured to detect radiation in a predetermined wavelength band and a lens element, wherein:
each of the unit cells is configured to generate a complete image of the scene; and
each of the unit cells is dedicated to an image channel;
combining selected images of the plurality of complete images provided by the plurality of unit cells that correspond to a given channel, thereby generating multi-channel image of the scene; and
providing one or more of the plurality of complete images and the multi-channel image.

14. The method as claimed in claim 13, wherein at least one pair of adjacent unit cells are dedicated to at least a polarimetric channel such that the polarization orientation of radiation filtered by a first unit cell of the pair of adjacent unit cells is orthogonal to the polarization orientation of radiation filtered by a second unit cell of the pair of adjacent unit cells.

15. The method as claimed in claim 13, further comprising:
comparing the complete images of unit cells that are dedicated to a given image channel;
obtaining a range estimate of a target within the scene based at least in part on the comparison of the images of unit cells dedicated to the given image channel; and
detecting linear polarization of objects within the scene.

16. The method as claimed in claim 13 wherein combining the plurality of complete images is performed by an image reconstruction algorithm executed by an image processing device.

17. The method as claimed in claim 13 wherein:
the lens element of each unit cell is configured and positioned to focus the complete image of the scene onto the array of pixels at an image location such that there is a sub-pixel offset between the image location of adjacent unit cells, thereby forming a sub-pixel parallax between complete images provided by adjacent unit cells; and
the method further comprises detecting high spatial content of the scene based at least in part on the sub-pixel parallax between the complete images of adjacent unit cells.

18. The method as claimed in claim 17, wherein comparing the complete images of unit cells dedicated to the given image channel further comprises evaluating the sub-pixel parallax between the complete images of unit cells dedicated to the given image channel.

19. A method of generating multi-channel imagery of a scene comprising:
receiving a plurality of complete images of the scene from a multi-channel imaging device comprising a plurality of unit cells, each of the unit cells comprising an array of pixels configured to detect radiation in a predetermined wavelength band and a lens element, wherein:
each of the unit cells is configured to generate a complete image of the scene; and
each of the unit cells is dedicated to an image channel; and
the lens element of each unit cell is configured and positioned to intentionally focus the complete image of the scene onto the array of pixels at an image location such that there is a sub-pixel offset between the image location of adjacent unit cells, thereby forming a sub-pixel parallax between the complete images of adjacent unit cells;
combining selected images of the plurality of complete images provided by the plurality of unit cells that correspond to a given channel, thereby generating multi-channel image of the scene; and
detecting high spatial content of the scene based at least in part on the sub-pixel parallax between the complete images of adjacent unit cells.

20. The method as claimed in claim 19, further comprising:
comparing the complete images of unit cells that are dedicated to a given image channel;
obtaining a range estimate of a target within the scene based at least in part on the comparison of the images of unit cells dedicated to the given image channel; and
detecting linear polarization of objects within the scene.

\* \* \* \* \*